US012520536B2

(12) United States Patent
He et al.

(10) Patent No.: US 12,520,536 B2
(45) Date of Patent: Jan. 6, 2026

(54) METAL OXIDE THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Jiayu He, Beijing (CN); Kun Zhao, Beijing (CN); Yan Qu, Beijing (CN); Liping Lei, Beijing (CN); Ce Ning, Beijing (CN); Zhengliang Li, Beijing (CN); Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 18/017,649

(22) PCT Filed: Feb. 17, 2022

(86) PCT No.: PCT/CN2022/076578
§ 371 (c)(1),
(2) Date: Jan. 23, 2023

(87) PCT Pub. No.: WO2023/155091
PCT Pub. Date: Aug. 24, 2023

(65) Prior Publication Data
US 2024/0250178 A1   Jul. 25, 2024

(51) Int. Cl.
*H10D 30/67* (2025.01)
*H10D 86/40* (2025.01)
*H10D 86/60* (2025.01)

(52) U.S. Cl.
CPC ....... *H10D 30/6755* (2025.01); *H10D 86/423* (2025.01); *H10D 86/60* (2025.01)

(58) Field of Classification Search
CPC .. H10D 30/6755; H10D 86/423; H10D 86/60; H10D 30/67; H10D 30/6757; G02F 1/133
(Continued)

(56) References Cited

U.S. PATENT DOCUMENTS

| 9,236,494 B2* | 1/2016 | Zan .................... H10D 30/6757 |
| 2020/0287054 A1 | 9/2020 | Suzuki et al. |
| 2025/0142886 A1* | 5/2025 | Yuan .................. H10D 30/6755 |

FOREIGN PATENT DOCUMENTS

| CN | 105633170 A | 6/2016 |
| CN | 106298879 A | 1/2017 |

(Continued)

*Primary Examiner* — Monica D Harrison
(74) *Attorney, Agent, or Firm* — HOUTTEMAN LAW LLC

(57) ABSTRACT

The present disclosure provides a metal oxide thin film transistor, an array substrate and a display device. A metal oxide thin film transistor in the present disclosure includes: a substrate, a first metal oxide semiconductor layer on the substrate, and a second metal oxide semiconductor layer on a side of the first metal oxide semiconductor layer away from the substrate; a carrier mobility of the first metal oxide semiconductor layer is higher than that of the second metal oxide semiconductor layer; a material of the first metal oxide semiconductor layer includes: a first metal oxide doped with a rear earth element; a difference between an electronegativity of the rare earth element and an electronegativity of oxygen element is greater than or equal to a difference between an electronegativity of a metal element in the first metal oxide and the electronegativity of oxygen element.

12 Claims, 3 Drawing Sheets

(58) Field of Classification Search
USPC .......................................................... 257/43
See application file for complete search history.

(56) References Cited

FOREIGN PATENT DOCUMENTS

| | | | |
|---|---|---|---|
| CN | 107916398 A | 4/2018 |
| CN | 114023768 A | 2/2022 |
| JP | 6756875 B1 | 9/2020 |
| WO | WO2021254125 A1 | 12/2021 |

* cited by examiner

METAL OXIDE THIN FILM TRANSISTOR, ARRAY SUBSTRATE AND DISPLAY DEVICE

CROSS-REFERENCE TO RELATED APPLICATION

This is a National Phase Application filed under 35 U.S.C. 371 as a national stage of PCT/CN2022/076578, filed on Feb. 17, 2022, the contents of which are incorporated herein by reference in their entirety.

TECHNICAL FIELD

The present disclosure relates to the field of display technology, and in particular, relate to a metal oxide thin film transistor, an array substrate and a display device.

BACKGROUND

Metal oxide thin film transistors are gradually increasing their market share in high-end displays due to their relatively high mobility, and metal oxide technology is also considered as the most likely implementation to replace present low-temperature polysilicon technology. With the upgrading of display products, the development of metal oxide thin film transistors having ultra-high mobility (mobility greater than 20 cm$^2$/V·s or even up to 30 cm$^2$/V·s or 50 cm$^2$/V·s) has become the focus of research and development of panel manufacturers.

For an existing metal oxide thin film transistor, a metal oxide semiconductor layer thereof may be formed by using a metal oxide material with relatively high mobility. Although the mobility of the metal oxide thin film transistor is greatly improved, the existing metal oxide thin film transistor, as a device in a product, is susceptible to factors such as light irradiation, manufacturing process, external water and oxygen, in the process of production or use, and thus the stability is not high enough and needs to be further improved.

SUMMARY

The present disclosure is intended to solve at least one of the technical problems in the related art, and provides a metal oxide thin film transistor, an array substrate and a display device.

In a first aspect, an embodiment of the present disclosure provides a metal oxide thin film transistor including: a substrate, a first metal oxide semiconductor layer on the substrate, and a second metal oxide semiconductor layer on a side of the first metal oxide semiconductor layer away from the substrate; wherein a carrier mobility of the first metal oxide semiconductor layer is higher than a carrier mobility of the second metal oxide semiconductor layer;

a material of the first metal oxide semiconductor layer includes: a first metal oxide doped with a rear earth element; a difference between an electronegativity of the rare earth element and an electronegativity of oxygen element is greater than or equal to a difference between an electronegativity of a metal element in the first metal oxide and the electronegativity of oxygen element.

In some embodiments, the rare earth element includes at least one of tantalum, niobium, neodymium, zirconium.

In some embodiments, the metal element in the first metal oxide includes at least one of indium, gallium, zinc, tin.

In some embodiments, an atomic percent of the rare earth element in the first metal oxide semiconductor layer is 0.01% to 5%.

In some embodiments, the atomic percent of the rare earth element in the first metal oxide semiconductor layer is 0.15% or 0.2%.

In some embodiments, a Hall mobility in the first metal oxide semiconductor layer is greater than or equal to 31 cm$^2$/V·s.

In some embodiments, a concentration of carriers in the first metal oxide semiconductor layer is greater than or equal to 3.5λE18 cm$^{-3}$.

In some embodiments, an etching slope angle of the first metal oxide semiconductor layer is 40 degrees to 60 degrees.

In some embodiments, etched side faces of the first metal oxide semiconductor layer and the second metal oxide semiconductor layer are in contact, and the etching slope angle of the first metal oxide semiconductor layer is equal to an etching slope angle of the second metal oxide semiconductor layer.

In some embodiments, a metal element in the second metal oxide includes at least one of indium, gallium, zinc, tin.

In a second aspect, an embodiment of the present disclosure provides an array substrate including a plurality of metal oxide thin film transistors as described above.

In a third aspect, an embodiment of the present disclosure provides a display device including array substrate as described above.

DETAIL DESCRIPTION OF EMBODIMENTS

Figure 1:
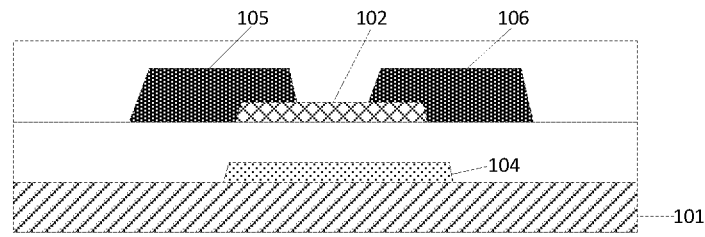
FIG. 1 is a schematic structural diagram of a metal oxide thin film transistor according to at least one embodiment of the present disclosure.

In order that a person skilled in the art can better understand the technical solutions of the present disclosure, the present disclosure is further described in detail below in conjunction with the accompanying drawings and specific implementations.

Unless otherwise defined, the technical or scientific terms used in the present disclosure shall have the usual meanings understood by persons with general skills in the art to which the present disclosure belongs. The terms "first", "second" and the like used in the present disclosure do not indicate any order, number or importance, but are only used to distinguish different components. Similarly, words such as "a", "an" or "the" do not imply a quantitative limit, but rather the existence of at least one. A word such as "comprising" or "including" means that an element or object appearing before the word covers an element or object or its equivalent listed after the word, without excluding other elements or objects. Words such as "connecting" or "coupling" are not limited to physical or mechanical connections, but may include electrical connections, whether direct or indirect. Words "up", "down", "left", "right", etc., are only used to represent relative position relationships, and when the absolute position of the described object changes, the relative position relationship may also change accordingly.

As a new type of thin film transistor, metal oxide thin film transistors can be applied to Liquid Crystal Display (LCD), Organic Light-Emitting Diode (OLED) display panel, mini light-emitting diode backlight or display panel, Quantum Dot Light Emitting Diode (QLED) display panel and other technologies.

At present, the relatively high mobility of the metal oxide thin film transistor is mainly determined by the material property of the metal oxide semiconductor layer. Taking the case that the metal oxide in the metal oxide thin film transistor is indium gallium zinc oxide (IGZO) as an example, oxygen (O) element can form compounds with the metal elements indium (In), gallium (Ga) and zinc (Zn), and provide or trap carriers (oxygen vacancies) according to the bonding of chemical bonds. Here, indium (In) can provide an electron transport path, enabling IGZO to have high mobility. Gallium (Ga) has high ionization energy and can inhibit electron mobility, inhibit the formation of oxygen vacancies, and generate new moving electrons. Zinc (Zn) can serve as a stabilizer, has a strong chemical bond that can bind oxygen ions, and can form a stable tetrahedral structure to form a relatively stable amorphous grain boundary.

It can be seen from the characteristics of the elements in IGZO in the metal oxide semiconductor layer that, the metal oxide thin film transistor made of IGZO can have a high mobility. However, the material of the metal oxide semiconductor layer in the metal oxide thin film transistor with relatively high mobility is likely to be affected by factors such as light irradiation, manufacturing process, external water and oxygen.

In addition, in order to obtain higher mobility, a plurality of metal oxide semiconductor layers may be stacked. However, also due to the material property of metal oxides, in the patterning process of the plurality of metal oxide semiconductor layers, a tailing phenomenon is likely to occur, and the formed etching slope angle is small, which further affects the stability of the metal oxide thin film transistor.

In order to solve at least one of the above technical problems, embodiments of the present disclosure provide a metal oxide thin film transistor, an array substrate and a display device. Hereinafter, the metal oxide thin film transistor, the array substrate and the display device provided by the present disclosure will be further described in detail in conjunction with the accompanying drawings and specific implementations.

Embodiments of the present disclosure provide a metal oxide thin film transistor. FIG. 1 is a schematic structural diagram of a metal oxide thin film transistor according to at least one embodiment of the present disclosure. As shown in FIG. 1, the metal oxide thin film transistor includes: a substrate 101, a first metal oxide semiconductor layer 102 on the substrate 101, and a second metal oxide semiconductor layer 103 on a side of the first metal oxide semiconductor layer 102 away from the substrate 101. A carrier mobility of the first metal oxide semiconductor layer 102 is higher than that of the second metal oxide semiconductor layer 103. A material of the first metal oxide semiconductor layer 102 includes: a first metal oxide doped with a rear earth element. A difference between an electronegativity of the rare earth element and an electronegativity of oxygen element is greater than or equal to a difference between an electronegativity of a metal element in the first metal oxide and the electronegativity of oxygen element.

The substrate 101 may be made of a rigid material such as glass, which may improve the supporting capacity of the substrate 101 to other layers thereon. Obviously, the substrate 101 may also be made of a flexible material such as polyimide (PI), which can improve the overall bending resistance and tensile resistance of the metal oxide thin film transistor so as to avoid the defect of broken circuit caused by the fracture of the substrate 101 due to stress generated in the process of bending, stretching or twisting. In practical applications, the material of the substrate 101 may be reasonably selected according to actual needs to ensure good performance of the metal oxide thin film transistor.

The metal oxide semiconductor layer of the metal oxide thin film transistor may be formed to have a single layer structure, that is, the metal oxide thin film transistor is provided with only one metal oxide semiconductor layer, i.e., the first metal oxide semiconductor layer 102. In this case, the structure is simple, the preparation difficulty of the metal oxide thin film transistor can be reduced, and the preparation costs can be saved. The first metal oxide semiconductor layer 102 in the metal oxide thin film transistor may be formed using a metal oxide, specifically, the material of the first metal oxide semiconductor layer 102 includes a first metal oxide doped with a rare earth element. The first metal oxide may be a metal oxide with a high mobility, which can ensure that the metal oxide thin film transistor has a high mobility, so as to improve the electrical performance of the metal oxide thin film transistor.

Moreover, the first metal oxide semiconductor layer 102 is further doped with a rare earth element. According to the critical value 1.7 of electronegativity difference, the greater the electronegativity difference, the stronger the bond energy of the formed ionic bond. Here, the difference between the electronegativity of the rare earth element and the electronegativity of oxygen (O) element is relatively large, and is generally greater than or equal to the difference between the electronegativity of the metal element in the first metal oxide and the electronegativity of oxygen (O) element. For example, the electronegativity of oxygen (O) element is 3.5, and a rare earth element with electronegativity less than 1.8 may be selected to dope with the first metal oxide, so that ionic bond with strong bond energy can be formed between the rare earth element and oxygen (O) element, and this bond energy is much stronger than the bond energy between the metal element and oxygen (O) element in an existing first metal oxide semiconductor layer. In this way, the material property of the first metal oxide semiconductor layer 102 can be more stable and the influence of the factors such as light irradiation, manufacturing process, external water and oxygen, and the like can be avoided, thereby ensuring the stability of the structure of the first metal oxide semiconductor layer 102, and in turn improving the stability of the metal oxide thin film transistor.

Figure 2:
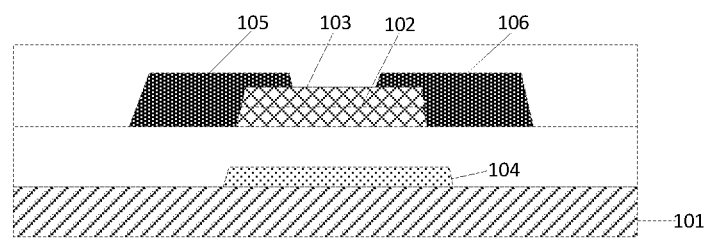
FIG. 2 is a schematic structural diagram of another metal oxide thin film transistor according to at least one embodiment of the present disclosure.

In another embodiment, the metal oxide semiconductor layer of the metal oxide thin film transistor may be formed to have a double-layer structure. As shown in FIG. 2, a first metal oxide semiconductor layer 102 is provided in the metal oxide thin film transistor, and a second metal oxide semiconductor layer 103 may be provided on the first metal oxide semiconductor layer 102. Since the first metal oxide semiconductor layer 102 is doped with a rare earth element, the structure of the formed first metal oxide semiconductor layer 102 is relatively stable, and is unlikely to be affected by the etching process. In the case that the second metal oxide semiconductor layer 103 and the first metal oxide semiconductor layer 102 are disposed in a stacked manner, the tailing phenomenon can be avoided, thereby ensuring the stability of the first metal oxide semiconductor layer 102 and the second metal oxide semiconductor layer 103. In addition, the second metal oxide semiconductor layer 103 may be made of a material with good stability. The mobility of the second metal oxide semiconductor layer 103 is not as high as the mobility of the first metal oxide semiconductor layer 102, but, in practical applications, carriers can mainly migrate through the first metal oxide semiconductor layer 102 to ensure that the metal oxide thin film transistor has a high mobility as a whole, and the second metal oxide semiconductor layer 103 can further improve the mobility of the metal oxide thin film transistor.

Moreover, by disposing the second metal oxide semiconductor layer 103 on the first metal oxide semiconductor layer 102, a light-shading effect can be achieved, which prevents ambient light or light emitted by light-emitting devices from directly irradiating onto the first metal oxide semiconductor layer 102, thereby achieving a good protection effect on the first metal oxide semiconductor layer 102, and ensuring good stability of the metal oxide thin film transistor as a whole.

Further, the second metal oxide semiconductor layer 103 and the first metal oxide semiconductor layer 102 may be etched using a same mask, therefore, no additional process step is required, and the preparation costs are not increased.

In some embodiments, the rare earth element includes at least one of tantalum (Ta), niobium (Nb), neodymium (Nd) and zirconium (Zr); the metal element in the first metal oxide includes at least one of indium (In), gallium (Ga), zinc (Zn) and tin (Sn).

Specifically, the first metal oxide may be at least one of indium gallium zinc oxide (IGZO), indium gallium tin oxide (IGTO), indium zinc oxide (IZO), indium tin oxide (ITO) and indium tin zinc oxide (ITZO), which are all metal oxides with high mobility, so as to ensure that the metal oxide thin film transistor has a high mobility as a whole. Specifically, the rare earth element may be at least one of tantalum (Ta), niobium (Nb), neodymium (Nd) and zirconium (Zr). Taking a case that the first metal oxide is indium gallium zinc oxide (IGZO) and the rare earth element is tantalum (Ta) as an example, the electronegativity of the tantalum (Ta) element is 1.5, and the electronegativity of oxygen (O) element is 3.5. According to the general critical value 1.7 of electronegativity difference, the ionic bond between two elements that have an electronegativity difference therebetween greater than 1.7 has strong bond energy. Thus, the ionic bond formed between tantalum (Ta) element and oxygen (O) element has strong bond energy. In this case, the structure of the first metal oxide can be more stable and the influence of the factors such as light irradiation, manufacturing process, external water and oxygen, and the like can be avoided, thereby ensuring the stability of the first metal oxide semiconductor layer 102, and in turn improving the stability of the metal oxide thin film transistor as a whole.

Furthermore, tantalum (Ta) has an ionic radius of 0.07 nanometers (nm), and when tantalum (Ta) is doped into zinc (Zn) oxide or Zn—In composite oxide, tantalum (Ta) can replace zinc (Zn), whereas the metal oxide has little or no change in crystal lattice structure. For ionic bonds, taking no account of the binding effect of oxygen ion, because positive ions have relatively large electron cloud, electron orbitals will overlap, so that the bonding structure will rarely, or even not, have weak ionic bonds, which is independent of its crystalline or amorphous state. Therefore, the stability of the first metal oxide is further improved, so as to further improve the stability of the metal oxide thin film transistor.

It will be appreciated that, a rare earth element whose electronegativity is other value may also be selected, such as niobium (Nb), neodymium (Nd), zirconium (Zr), etc., of course, a mixture of the foregoing metal elements may also be selected, as long as it is ensured that the difference between its electronegativity and the electronegativity of oxygen is large, so as to ensure that strong ionic bonds can be formed therebetween, thereby improving the stability of the metal oxide thin film transistor as a whole.

In some embodiments, an atomic percent of the rare earth element in the first metal oxide semiconductor layer 102 is 0.01% to 5%.

Taking the case that the rare earth element in the first metal oxide semiconductor layer 102 is tantalum (Ta) as an example, the atomic percent of tantalum (Ta) in the first metal oxide semiconductor layer 102 is 0.01% to 5%, which can ensure formation of strong ionic bonds between tantalum (Ta) and oxygen (O). In this way, the material property of the first metal oxide can be more stable, and the influence of the factors such as light irradiation, manufacturing process, external water and oxygen, and the like can be avoided, thereby ensuring the stability of the first metal oxide semiconductor layer 102, and thus improving the stability of the metal oxide thin film transistor as a whole.

It should be noted here that, in a case that the rare earth element is the above-mentioned niobium (Nb), neodymium (Nd), zirconium (Zr), or a mixture of a plurality of metal elements from tantalum (Ta), niobium (Nb), neodymium (Nd), zirconium (Zr), its atomic percent may also be 0.01% to 5%, and the specific value may be set according to actual needs.

In an embodiment, the atomic percent of the rare earth element in the first metal oxide semiconductor layer 102 is 0.15% or 0.2%. In this case, the carrier trapping defect can be effectively reduced by inhibiting formation of oxygen vacancies and reducing impurities in the IGZO film, so as to ensure the strong stability of the first metal oxide to improve the stability of the metal oxide thin film transistor as a whole.

In some embodiments, a Hall mobility in the first metal oxide semiconductor layer 102 is greater than or equal to 31 $cm^2/V \cdot s$. A concentration of carriers in the first metal oxide semiconductor layer 102 is greater than or equal to $3.5 \times E18$ $cm^{-3}$.

The high Hall mobility of carriers and high concentration of carriers in the first metal oxide semiconductor layer 102 can ensure that the first metal oxide semiconductor layer 102 has a high mobility, so as to ensure that the metal oxide thin film transistor has a high mobility as a whole.

In some embodiments, an etching slope angle of the first metal oxide semiconductor layer 102 is 40 degrees to 60 degrees, which can ensure that film layer(s) on the first metal oxide semiconductor layer 102 can be effectively supported in the case that a plurality of film layers are disposed in a stacked manner, avoiding the influence of a too large or too small etching slope angle on the bonding stability between a plurality of film layers. Meanwhile, the tailing phenomenon can be avoided, ensuring the stability of the first metal oxide semiconductor layer 102 and the second metal oxide semiconductor layer 103.

In some embodiments, etched side faces of the first metal oxide semiconductor layer 102 and the second metal oxide semiconductor layer 103 are in contact with each other, and the etching slope angle of the first metal oxide semiconductor layer 102 is equal to the etching slope angle of the second metal oxide semiconductor layer 103.

In practical applications, an area of the second metal oxide semiconductor layer 103 may be substantially equal to an area of the first metal oxide semiconductor layer 102. An orthographic projection of the second metal oxide semiconductor layer 103 on the substrate 101 is located within an orthographic projection of the first metal oxide semiconductor layer 102 on the substrate 101. Meanwhile, the first metal oxide semiconductor layer 102 and the second metal oxide semiconductor layer 103 may be formed to have a flat etched side face. In this way, the second metal oxide semiconductor layer 103 can cover the first metal oxide semiconductor layer 102, so as to achieve a good light-shading effect and prevent ambient light or light emitted by light-emitting devices from directly irradiating onto the first metal oxide semiconductor layer 102, thereby achieving a good protection effect on the first metal oxide semiconductor layer 102, avoiding the tailing phenomenon in the preparation process, and ensuring good stability of the metal oxide thin film transistor as a whole.

In some embodiments, as shown in FIGS. 1 and 2, the metal oxide thin film transistor further includes: a gate 104 on a side of the first metal oxide semiconductor layer 102 close to the substrate 101. An orthographic projection of the gate 104 on the substrate 101 is located within the orthographic projection of the first metal oxide semiconductor layer 102 on the substrate 101.

As shown in FIG. 1, in the metal oxide thin film transistor provided only with the first metal oxide semiconductor layer 102, the gate 104 may be located on the side of the first metal oxide semiconductor layer 102 close to the substrate 101, and a gate insulation layer may be provided between the gate 104 and the first metal oxide semiconductor layer 102 to avoid a short circuit between the first metal oxide semiconductor layer 102 and the gate 104, and constitute a bottom-gate metal oxide thin film transistor. When a turn-on control signal is input to the gate 104, the first metal oxide semiconductor layer 102 and the second metal oxide semiconductor layer 103 can be in a conducting state. If the metal oxide thin-film transistor is an N-type transistor, the first metal oxide semiconductor layer 102 and the second metal oxide semiconductor layer 103 can be in a conducting state when a high-level signal is input to the gate 104; if the metal oxide thin film transistor is a P-type transistor, the first metal oxide semiconductor layer 102 and the second metal oxide semiconductor layer 103 can be in a conducting state when a low-level signal is input to the gate 104.

As shown in FIG. 2, in the metal oxide thin film transistor provided with a double-layer structure of the first metal oxide semiconductor layer 102 and the second metal oxide semiconductor layer 103, the gate 104 may be located on the side of the first metal oxide semiconductor layer 102 close to the substrate 101, and a gate insulation layer may be provided between the gate 104 and the first metal oxide semiconductor layer 102 to avoid a short circuit between the first metal oxide semiconductor layer 102 and the gate 104, and constitute a bottom-gate metal oxide thin film transistor. When a turn-on control signal is input to the gate 104, the first metal oxide semiconductor layer 102 can be in a conducting state. If the metal oxide thin-film transistor is an N-type transistor, the first metal oxide semiconductor layer 102 can be in a conducting state when a high-level signal is input to the gate 104; if the metal oxide thin film transistor is a P-type transistor, the first metal oxide semiconductor layer 102 can be in a conducting state when a low-level signal is input to the gate 104.

In a bottom-gate metal oxide thin film transistor, the gate 104 can play a role in shading light. In a liquid crystal display device, the gate 104 can prevent light emitted by the backlight from directly irradiating onto the first metal oxide semiconductor layer 102, thereby achieving a good protection effect on the first metal oxide semiconductor layer 102, and ensuring good stability of the metal oxide thin film transistor as a whole.

Figure 3:
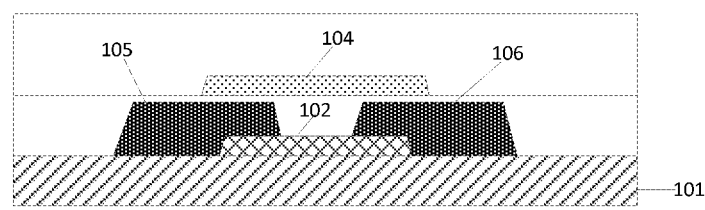
FIG. 3 is a schematic structural diagram of another metal oxide thin film transistor according to at least one embodiment of the present disclosure.

FIG. 3 is a schematic structural diagram of another metal oxide thin film transistor according to at least one embodiment of the present disclosure. As shown in FIG. 3, the metal oxide thin film transistor further includes: a gate 104 on a side of the first metal oxide semiconductor layer 102 away from the substrate 101. An orthographic projection of the gate 104 on the substrate 101 is located within the orthographic projection of the first metal oxide semiconductor layer 102 on the substrate 101.

In the metal oxide thin film transistor provided only with the first metal oxide semiconductor layer 102, the gate 104 may be located on the side of the first metal oxide semiconductor layer 102 away from the substrate 101, and a gate insulation layer may be provided between the gate 104 and the first metal oxide semiconductor layer 102 to avoid a short circuit between the first metal oxide semiconductor layer 102 and the gate 104, and constitute a top-gate metal oxide thin film transistor. When a turn-on control signal is input to the gate 104, the first metal oxide semiconductor layer 102 can be in a conducting state. If the metal oxide thin-film transistor is an N-type transistor, the first metal oxide semiconductor layer 102 can be in a conducting state when a high-level signal is input to the gate 104; if the metal oxide thin film transistor is a P-type transistor, the first metal oxide semiconductor layer 102 can be in a conducting state when a low-level signal is input to the gate 104.

Figure 4:
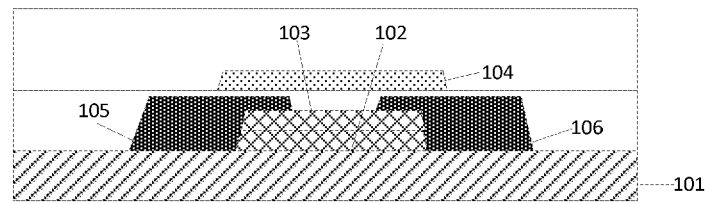
FIG. 4 is a schematic structural diagram of still another metal oxide thin film transistor according to at least one embodiment of the present disclosure.

FIG. 4 is a schematic structural diagram of another metal oxide thin film transistor according to at least one embodiment of the present disclosure. As shown in FIG. 4, the metal oxide thin film transistor further includes: a gate 104 on a side of the second metal oxide semiconductor layer 103 away from the substrate 101. An orthographic projection of the gate 104 on the substrate 101 is located within the orthographic projection of the first metal oxide semiconductor layer 102 on the substrate 101.

In the metal oxide thin film transistor provided with a double-layer structure of the first metal oxide semiconductor layer 102 and the second metal oxide semiconductor layer 103, the gate 104 may be located on the side of the second metal oxide semiconductor layer 103 away from the substrate 101, and a gate insulation layer may be provided between the gate 104 and the second metal oxide semiconductor layer 103 to avoid a short circuit between the second metal oxide semiconductor layer 103 and the gate 104, and constitute a top-gate metal oxide thin film transistor. When a turn-on control signal is input to the gate 104, the first metal oxide semiconductor layer 102 and the second metal oxide semiconductor layer 103 can be in a conducting state. If the metal oxide thin-film transistor is an N-type transistor, the first metal oxide semiconductor layer 102 and the second metal oxide semiconductor layer 103 can be in a conducting state when a high-level signal is input to the gate 104; if the metal oxide thin film transistor is a P-type transistor, the first metal oxide semiconductor layer 102 and the second metal oxide semiconductor layer 103 can be in a conducting state when a low-level signal is input to the gate 104.

In a top-gate type metal oxide thin film transistor, the gate 104 can play a role in shading light. In an organic light-emitting diode display device, the gate 104 can prevent light emitted by light-emitting devices from directly irradiating onto the first metal oxide semiconductor layer 102, thereby achieving a good protection effect on the first metal oxide semiconductor layer 102, and ensuring good stability of the metal oxide thin film transistor as a whole.

In some embodiments, as shown in FIGS. 1 and 3, the metal oxide thin film transistor further includes: a source 105 and a drain 106 located on the side of the first metal oxide semiconductor layer 102 away from the substrate 101. The first metal oxide semiconductor layer 102 has a first channel region 1020, and a first source contact region 1021 and a first drain contact region 1022 respectively located at two ends of the first channel region 1020. The source 105 is electrically connected to the first source contact region 1021, and the drain 106 is electrically connected to the first drain contact region 1022.

The metal oxide thin film transistors shown in FIGS. 1 and 3 are provided only with one metal oxide semiconductor layer (i.e., the first metal oxide semiconductor layer 102). In the preparation process, the two ends of the first metal oxide semiconductor layer 102 may be made conductive by using heavily doping or particle injection process, so as to form the first channel region 1020 and the first source contact region 1021 and the first drain contact region 1022 respectively located at two ends of the first channel region 1020. Ohmic contact is formed between the source 105 and the first source contact region 1021, and ohmic contact is also formed between the drain 106 and the first drain contact region 1022. When a turn-on control signal is input to the gate 104, the first metal oxide semiconductor layer 102 can be conducting, so that a data signal and the like is transmitted from the source 105 of the metal oxide thin film transistor to the drain 106 to realize a function of controlling signal transmission.

In some embodiments, as shown in FIGS. 2 and 4, the metal oxide thin film transistor further includes: a source 105 and a drain 106 located on the side of the second metal oxide semiconductor layer 103 away from the substrate 101. The second metal oxide semiconductor layer 103 has a second channel region 1030, and a second source contact region 1031 and a second drain contact region 1032 respectively located at two ends of the second channel region 1030. The source 105 is electrically connected to the second source contact region 1031, and the drain 106 is electrically connected to the second drain contact region 1032.

The metal oxide thin film transistors shown in FIGS. 2 and 4 are provided with two metal oxide semiconductor layers, i.e., the first metal oxide semiconductor layer 102 and the second metal oxide semiconductor layer 103 disposed in the stacked manner. In the preparation process, the two ends of both the first metal oxide semiconductor layer 102 and the second metal oxide semiconductor layer 103 may be made conductive by using heavily doping or particle injection process, so as to form the first channel region 1020, the first source contact region 1021 and the first drain contact region 1022 respectively located at two ends of the first channel region 1020, the second channel region 1030, and the second source contact region 1031 and the second drain contact region 1032 respectively located at two ends of the second channel region 1030. Ohmic contact is formed between the source 105 and the first and second source contact regions 1021, 1031, and ohmic contact is also formed between the drain 106 and the first and second drain contact regions 1022, 1032. When a turn-on control signal is input to the gate 104, the first metal oxide semiconductor layer 102 and the second metal oxide semiconductor layer 103 can be conducting, so that a data signal and the like is transmitted from the source 105 of the metal oxide thin film transistor to the drain 106 to realize the function of controlling signal transmission.

An embodiment of the present disclosure further provides an array substrate. In the present and subsequent embodiments of the present disclosure, description is given by taking the bottom-gate type metal oxide thin film transistor provided with only one metal oxide semiconductor layer (i.e., the first metal oxide semiconductor layer 102) as shown in FIG. 1 as an example. Meanwhile, the array substrate may be a liquid crystal array substrate, and may be applied to a liquid crystal display device, or may be an organic light-emitting diode array substrate, and may be applied to an organic light-emitting diode display device. Hereinafter, description will be given by taking the case that the array substrate is applied to a liquid crystal display device as an example. In the case that the array substrate is an organic light-emitting diode array substrate, the implementation principle and beneficial effect thereof are the same as those of the liquid crystal array substrate, and will not be repeated herein.

Figure 5:
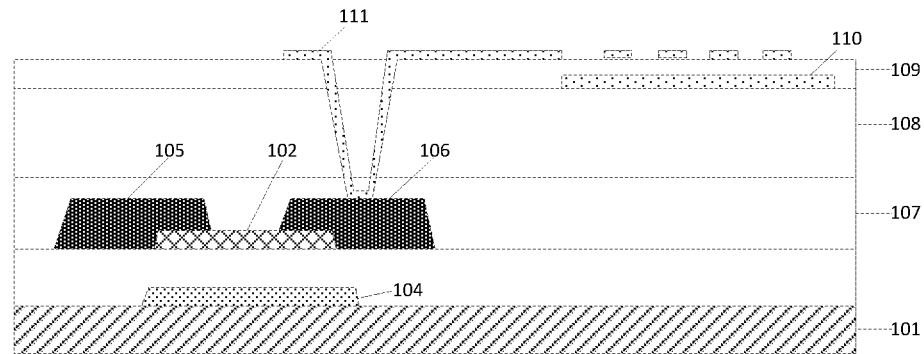
FIG. 5 is a schematic structural diagram of an array substrate according to at least one embodiment of the present disclosure.

FIG. 5 is a schematic structural diagram of an array substrate according to at least one embodiment of the present disclosure. As shown in FIG. 5, the array substrate includes a plurality of metal oxide thin film transistors (only one shown in the figure) provided by any one of the aforementioned embodiments. The array substrate further includes: a first protective layer 107, an organic insulation layer 108 and a second protective layer 109. The first protective layer 107 is located on a side, away from the substrate 101, of a layer where the source 105 and the drain 106 are located. The second protective layer 108 is located on a side of the first protective layer 107 away from the substrate 101. The organic insulation layer 109 is located between the first protective layer 107 and the second protective layer 108.

The first protective layer 107 and the second protective layer 109 are generally made of an inorganic material. The first protective layer 107 and the second protective layer 109 protect the first metal oxide semiconductor layer 102, so as to prevent damage to the first metal oxide semiconductor layer 102 in a subsequent etching process. The organic insulation layer 108 may be disposed between the first protective layer 107 and the second protective layer 109 to improve flexibility of the first protective layer 107 and the second protective layer 109, which can relieve stress generated during the application process, and prevent the first protective layer 107 and the second protective layer 109 made of an inorganic material from breaking due to the stress. At the same time, outside water and oxygen and other gases can be prevented from penetrating into the first metal oxide semiconductor layer 102, thereby further protecting the first metal oxide semiconductor layer 102.

In some embodiments, the first protective layer 107 may include a plurality of protective sub-layers.

The first protective layer 107 may be formed by a plurality of protective sub-layers. For example, as shown in the array substrate shown in FIG. 6, the first protective layer 107 is divided into two protective sub-layers, i.e., the first protective sub-layer 1071 and the second protective sub-layer 1072. Alternatively, as shown in the array substrate shown in FIG. 7, the first protective layer 107 is divided into three protective sub-layers, i.e., the first protective sub-layer 1071, the second protective sub-layer 1072 and the third protective sub-layer 1073. The plurality of protective sub-layers may further protect the first metal oxide semiconductor layer 102, and meanwhile the plurality of protective sub-layers can further relieve the stress to prevent the first protective layer 107 and the second protective layer 109 from breaking due to the stress, thereby further improving the stability of the first metal oxide semiconductor layer 102 in the metal oxide thin film transistor.

In some embodiments, the material of at least one protective sub-layer of the first protective layer 107 is silicon oxide. The material of the second protective layer 109 includes silicon nitride.

The protective sub-layer made of an oxide in the first protective layer 107 is close to the first metal oxide semiconductor layer, and can supplement oxygen to the first metal oxide semiconductor layer 102. Oxygen element can be injected into the first metal oxide semiconductor layer 102 when preparing a silicon oxide film layer, so as to avoid occurrence of defects in the first metal oxide semiconductor layer 102, improving the stability of the first metal oxide semiconductor layer 102. The second protective layer 109 may be made of silicon nitride with low hydrogen content, so as to prevent hydrogen element from affecting the stability of the first metal oxide semiconductor layer 102. It will be appreciated that, in the first protective layer 107, in addition to the protective sub-layer made of silicon oxide, the remaining protective sub-layers may also be made of silicon nitride to further improve the stability of the first metal oxide semiconductor layer 102.

Figure 6:
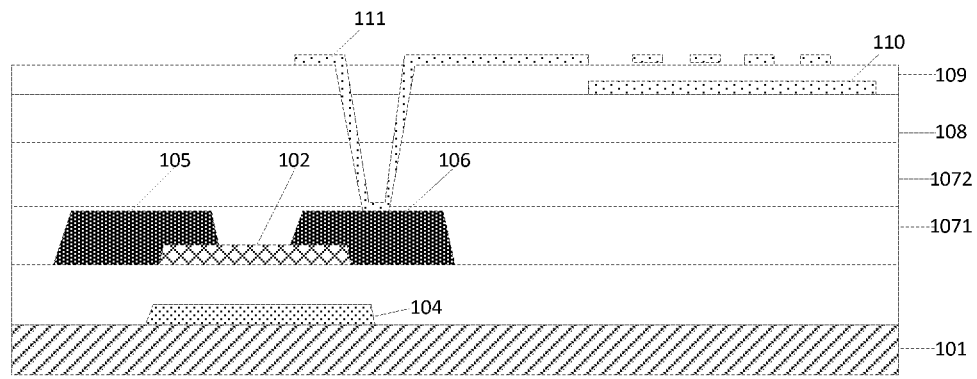
FIG. 6 is a schematic structural diagram of another array substrate according to at least one embodiment of the present disclosure.
Figure 7:
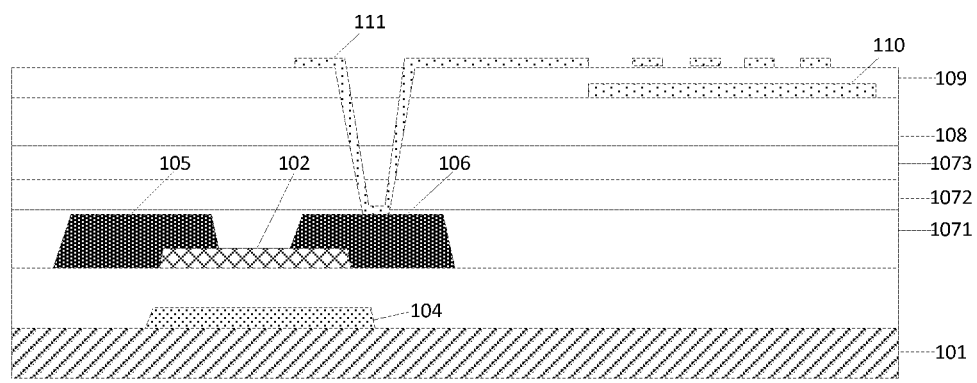
FIG. 7 is a schematic structural diagram of another array substrate according to at least one embodiment of the present disclosure.

In some embodiments, as shown in FIGS. 5 to 7, the array substrate further includes: a common electrode 110 and a pixel electrode 111. The common electrode 110 is located on a side of the second protective layer 109 close to the substrate 101. The pixel electrode 111 is located on a side of the second protective layer 109 away from the substrate 101.

In the liquid crystal display device, a common signal may be input to the common electrode 110 in the array substrate, a pixel signal may be input to the pixel electrode 111, and an electric field may be formed between the common electrode 110 and the pixel electrode 111 to drive liquid crystal molecules in the liquid crystal layer to be deflected to realize display function. It will be appreciated that the array substrate may also be used in an organic light-emitting diode display device, and the array substrate will no longer be provided with structures such as the common electrode 110 and the pixel electrode 111. Light-emitting devices may be provided in the array substrate, and the drain 109 of the metal oxide thin film transistor in the array substrate may be electrically connected to the anode of the light-emitting device to provide a driving signal to the light-emitting device, causing the light-emitting device to emit light and realizing the display function.

In some embodiments, an orthographic projection of the common electrode 110 on the substrate 101 and an orthographic projection of the pixel electrode 111 on the substrate 101 do not overlap.

The common electrode 110 and the pixel electrode 111 do not overlap, and an electric field can be formed therebetween to drive liquid crystal molecules in a VA-type liquid crystal display device to be deflected to realize the display function. It will be appreciated that the common electrode 110 and the pixel electrode 111 may also be disposed directly opposite to each other to form a TN-type display device. Obviously, the common electrode 110 and the pixel electrode 111 may also be disposed in other ways, which will not be listed here.

Figure 8:
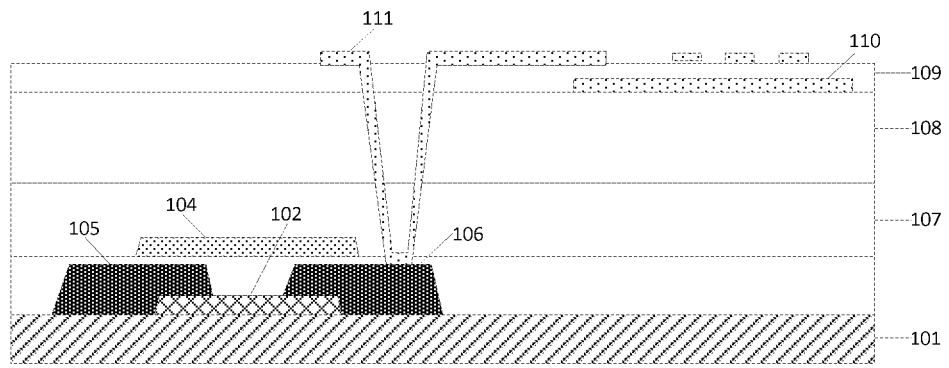
FIGS. 8 to 10 are schematic structural diagrams of other three array substrates according to at least one embodiment of the present disclosure.
Figure 9:
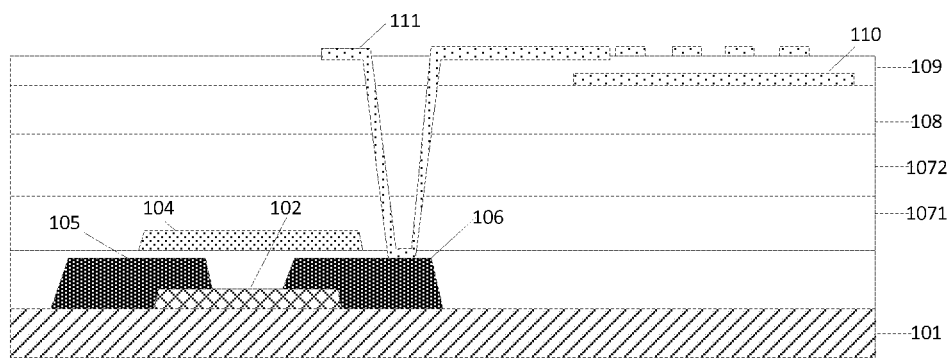
Figure 10:
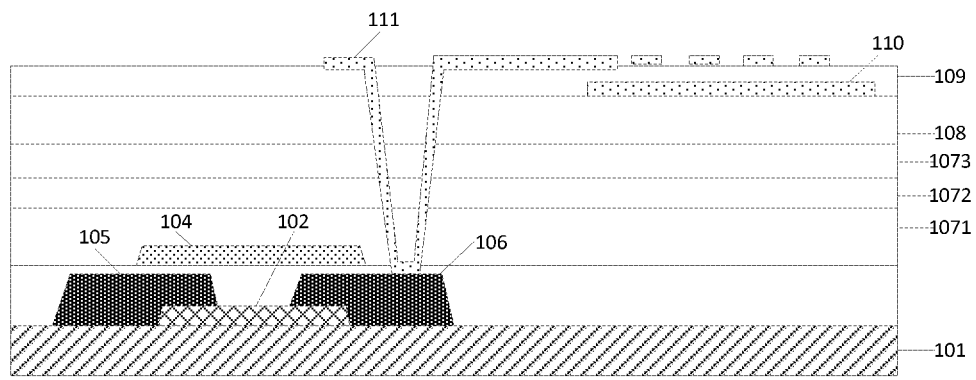

It should be noted herein that the metal oxide thin film transistors in the array substrates shown in FIGS. 5 to 7 are all bottom-gate metal oxide thin film transistors. Obviously, the metal oxide thin film transistors in the array substrates provided by the embodiments of the present disclosure may also be top-gate metal oxide thin film transistors, the structures of which are specifically shown in FIGS. 8 to 10, the implementation principles and beneficial effects thereof are the same as those of the array substrates shown in FIGS. 5 to 7, and will not be repeated herein.

An embodiment of the present disclosure further provides a display device which includes an array substrate provided in any one of the above embodiments, and further includes a color filter substrate and a liquid crystal layer. The color filter substrate is disposed opposite to the array substrate, and the liquid crystal layer is located between the array substrate and the color filter substrate. Liquid crystal molecules in the liquid crystal layer can be deflected according to the driving signal provided by the array substrate to allow light emitted by the backlight to transmit therethrough, and the color filter substrate can convert the transmitted light into different colors to realize multi-color display. The display device may be any product or component with a display function such as a mobile phone, a tablet computer, a television, a monitor, a laptop computer, a digital photo frame, a navigator, etc., and the implementation principle and beneficial effect thereof are the same as those of the above array substrate and metal oxide thin film transistor, and will not be repeated herein.

It will be appreciated that the above implementations are only exemplary implementations adopted to illustrate the principles of the present disclosure. However, the present disclosure is not limited thereto. For those of ordinary skill in the art, various variations and improvements may be made without departing from the spirit and essence of the present disclosure, and these variants and improvements are also considered to be within the protection scope of the present disclosure.

What is claimed is:

1. A metal oxide thin film transistor, comprising: a substrate, a first metal oxide semiconductor layer on the substrate, and a second metal oxide semiconductor layer on a side of the first metal oxide semiconductor layer away from the substrate; wherein a carrier mobility of the first metal oxide semiconductor layer is higher than a carrier mobility of the second metal oxide semiconductor layer;
   a material of the first metal oxide semiconductor layer comprises: a first metal oxide doped with a rear earth element; and a difference between an electronegativity of the rare earth element and an electronegativity of oxygen element is greater than or equal to a difference between an electronegativity of a metal element in the first metal oxide and the electronegativity of oxygen element.

2. The metal oxide thin film transistor according to claim 1, wherein the rare earth element comprises at least one of tantalum, niobium, neodymium, zirconium.

3. The metal oxide thin film transistor according to claim 1, wherein the metal element in the first metal oxide comprises at least one of indium, gallium, zinc, tin.

4. The metal oxide thin film transistor according to claim 1, wherein an atomic percent of the rare earth element in the first metal oxide semiconductor layer is 0.01% to 5%.

5. The metal oxide thin film transistor according to claim 4, wherein the atomic percent of the rare earth element in the first metal oxide semiconductor layer is 0.15% or 0.2%.

6. The metal oxide thin film transistor according to claim 1, wherein a Hall mobility in the first metal oxide semiconductor layer is greater than or equal to 31 $cm^2/V \cdot s$.

7. The metal oxide thin film transistor according to claim 1, wherein a concentration of carriers in the first metal oxide semiconductor layer is greater than or equal to $3.5 \times E18$ $cm^{-3}$.

8. The metal oxide thin film transistor according to claim 1, wherein an etching slope angle of the first metal oxide semiconductor layer is 40 degrees to 60 degrees.

9. The metal oxide thin film transistor according to claim 8, wherein etched side faces of the first metal oxide semiconductor layer and the second metal oxide semiconductor layer are in contact, and the etching slope angle of the first metal oxide semiconductor layer is equal to an etching slope angle of the second metal oxide semiconductor layer.

10. The metal oxide thin film transistor according to claim 1, wherein a metal element in the second metal oxide comprises at least one of indium, gallium, zinc, tin.

11. An array substrate, comprising the metal oxide thin film transistor according to claim 1.

12. A display device, comprising the array substrate according to claim 11.

\* \* \* \* \*